United States Patent
Aoki et al.

(10) Patent No.: US 12,014,125 B2
(45) Date of Patent: *Jun. 18, 2024

(54) ICT RESOURCE MANAGEMENT DEVICE, ICT RESOURCE MANAGEMENT METHOD, AND ICT RESOURCE MANAGEMENT PROGRAM

(71) Applicant: Nippon Telegraph and Telephone Corporation, Tokyo (JP)

(72) Inventors: Daisuke Aoki, Tokyo (JP); Takeshi Kuwagata, Tokyo (JP); Katsuyuki Hasebe, Tokyo (JP); Makoto Kanzaki, Tokyo (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 602 days.

This patent is subject to a terminal disclaimer.

(21) Appl. No.: 17/311,073

(22) PCT Filed: Nov. 25, 2019

(86) PCT No.: PCT/JP2019/045932
§ 371 (c)(1),
(2) Date: Jun. 4, 2021

(87) PCT Pub. No.: WO2020/116221
PCT Pub. Date: Jun. 11, 2020

(65) Prior Publication Data
US 2022/0043946 A1     Feb. 10, 2022

(30) Foreign Application Priority Data
Dec. 4, 2018   (JP) .................. 2018-227538

(51) Int. Cl.
G06F 9/455     (2018.01)
G06F 8/76      (2018.01)
G06F 30/18     (2020.01)

(52) U.S. Cl.
CPC ............... *G06F 30/18* (2020.01); *G06F 8/76* (2013.01); *G06F 9/45558* (2013.01); *G06F 2009/45562* (2013.01)

(58) Field of Classification Search
None
See application file for complete search history.

(56) References Cited

U.S. PATENT DOCUMENTS

2013/0232498 A1   9/2013   Mangtani et al.
2014/0189689 A1*  7/2014   Masuno ............... G06F 9/5088
                                              718/1

(Continued)

FOREIGN PATENT DOCUMENTS

JP   2015-056182   3/2015
JP   2018-032897   3/2018

*Primary Examiner* — Craig C Dorais
(74) *Attorney, Agent, or Firm* — Fish & Richardson P.C.

(57) ABSTRACT

An ICT resource management device which manages a physical node and a virtual node, each as an ICT resource, includes: a configuration information management part configured to manage physical layer configuration information of the physical node on a physical layer and virtual layer configuration information of the virtual node on a virtual layer; a layer mapping part configured to perform mapping of the physical layer and the virtual layer; a blueprint creation part configured to, when an externally-provided device requests a change in the configuration, create a blueprint which is design information on an infrastructure required for the configuration change, based on the physical layer configuration information, the virtual layer configuration information, and mapping information obtained as a result of the mapping; and an orchestrator part configured to access and run a program operative via an API, based on the blueprint, to thereby perform orchestration of the virtual layer.

9 Claims, 6 Drawing Sheets

(56) References Cited

U.S. PATENT DOCUMENTS

| | | |
|---|---|---|
| 2015/0082308 A1 | 3/2015 | Kiess et al. |
| 2015/0172115 A1* | 6/2015 | Nguyen .............. H04L 41/0896 709/226 |
| 2018/0322556 A1 | 11/2018 | Padmanabh et al. |

* cited by examiner

| | Node ID | State | Host Name | IP Address | VM ID | Service Used | User |
|---|---|---|---|---|---|---|---|
| Physical | PH1 | OK | host A | XXX | VI-1, VI-2 | ser1 | user1 |
| | PH2 | OK | host B | XXX | VI-3 | ser2 | user2 |
| | ... | ... | ... | ... | ... | ... | ... |

| | Node ID | State | VM Name | IP Address | Physical Device ID |
|---|---|---|---|---|---|
| Virtual | VI-1 | OK | VM1 | XXX | PH1 |
| | VI-2 | OK | VM2 | XXX | PH1 |
| | VI-3 | OK | VM3 | XXX | PH2 |
| | ... | ... | ... | ... | ... |

FIG. 5

24 Blueprint

Service template
- Catalog (Create VM)
- Catalog (Set NW)
- Catalog (Set container)

Parameter
- 5VM Web:3VM AP:2VM
- Assign IP
- Execute copy by Rancher

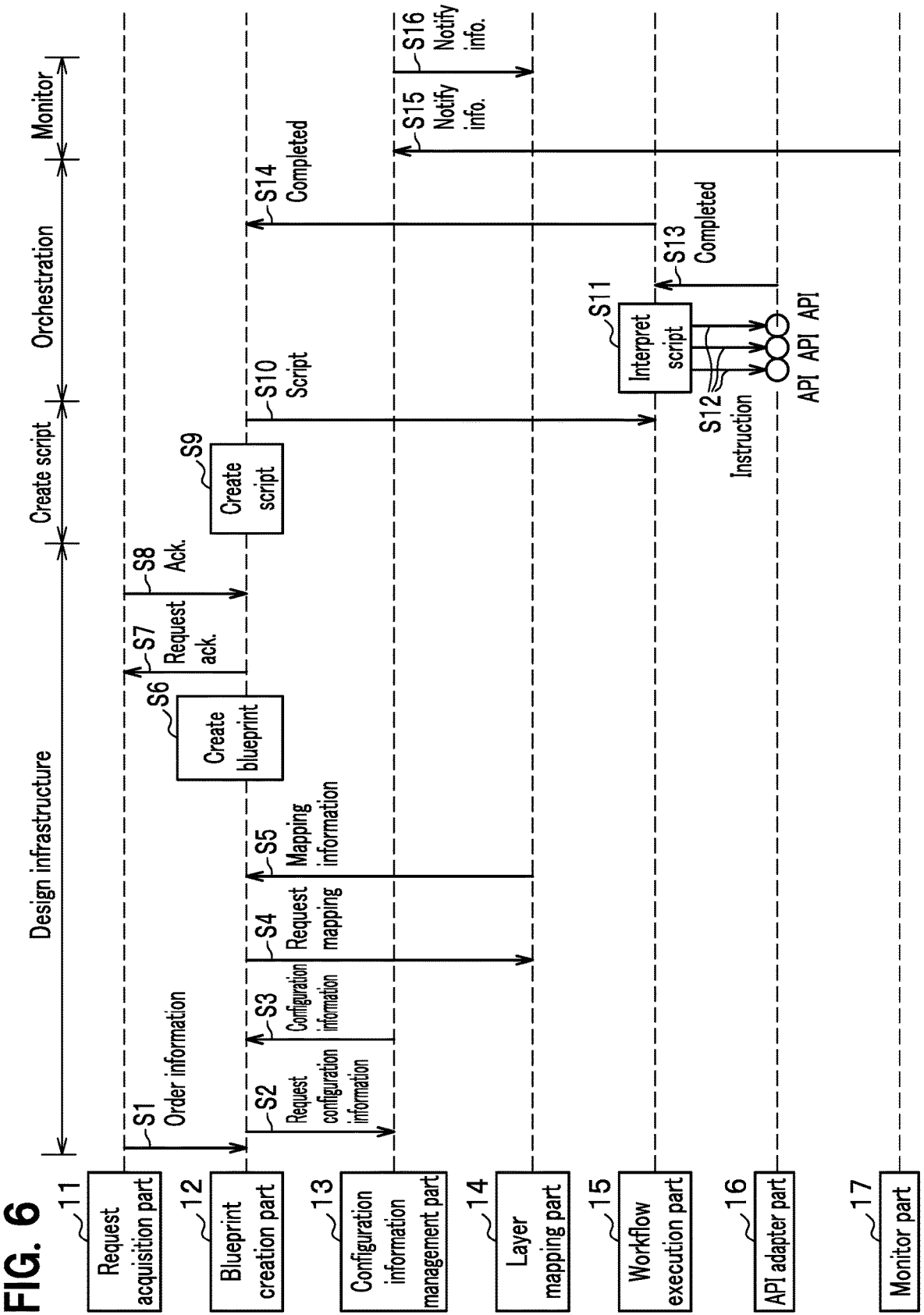

ICT RESOURCE MANAGEMENT DEVICE, ICT RESOURCE MANAGEMENT METHOD, AND ICT RESOURCE MANAGEMENT PROGRAM

CROSS-REFERENCE TO RELATED APPLICATIONS

This application is a National Stage application under 35 U.S.C. § 371 of International Application No. PCT/JP2019/045932, having an International Filing Date of Nov. 25, 2019, which claims priority to Japanese Application Serial No. 2018-227538, filed on Dec. 4, 2018. The disclosure of the prior application is considered part of the disclosure of this application, and is incorporated in its entirety into this application.

TECHNICAL FIELD

The present invention relates to an ICT (Information and Communication Technology) resource management device, an ICT resource management method, and an ICT resource management program.

BACKGROUND ART

Techniques to provide a service from a service provider to an end user have been increasingly developed these years. For example, Patent Document 1 discloses that "An inter-business operator package service build and deploy device provides, in response to an order request for communication service use from a terminal of a service provider, a package of one or more communication services different from each other publicized by communication services API by wholesale service providers. The device includes a package build and deploy function unit that: retains a catalog describing specifications of communication wholesale services and coordination rules defining coordination among various communication services; builds and deploys a coordination service coordinating as a package communication service APIs corresponding to a plurality of communication services requested by an order on the basis of the retained catalog and coordination rules at the time of order request for use of the plurality of communication services from the terminal; and provides the built and deployed coordination service for the terminal".

RELATED ART DOCUMENT

Patent Document

Patent Document 1: Japanese Laid-Open Patent Application, Publication No. 2018-32897 (Claim 1)

SUMMARY OF THE INVENTION

Problems to be Solved by the Invention

A system to provide a service includes, for example, a distributed system to which virtualization technology is applied. The distributed system can be constructed by, for example but not limited to, a group of devices installed in each of a plurality of data centers located in respective places geographically different from each other. The distributed system to which virtualization technology is applied includes: a physical layer which is a group of physical nodes (for example, a computing machine, a router, and a sensor) included in the distributed system; and a virtual layer which is a group of virtual nodes, each of which is configured and is operated on the physical node. In the distributed system to which virtualization technology is applied, two types of configuration management are performed, that is, a configuration management to the physical layer and a configuration management to the virtual layer. A distributed system engineer performs designs both the physical layer and the virtual layer.

Let us assume an example in which, in order to make available a service provided by a device (for example, an IoT (Internet of Things) device) connected to a physical node, a distributed system requires a change in a configuration such as arrangement of a new application to a virtual node. In this case, because a physical layer of interest is abstracted by virtualization technology, a virtual node on which the application is deployed cannot be specified immediately. Thus, in the conventional technology, an engineer specifies a virtual node of interest by checking a physical layer against a corresponding virtual layer. This requires, however, manual intervention, which disadvantageously prevents an operation in a distributed system from being automated and increase an operation cost.

In light of the background described above, the present invention has been made in an attempt to automate an operation in a distributed system and reduce a cost to operate the distributed system to which virtualization technology is applied.

Means for Solving the Problems

In order to solve the problems described above, according to a first aspect of the disclosure, an ICT resource management device which manages a physical node and a virtual node, each as an ICT resource, includes: a configuration information management part configured to manage physical layer configuration information which is information on a configuration of the physical node on a physical layer and virtual layer configuration information which is information on a configuration of the virtual node on a virtual layer; a layer mapping part configured to perform mapping of the physical layer and the virtual layer; a blueprint creation part configured to, when an externally-provided device requests a change in the configuration, create a blueprint which is design information on an infrastructure required for the configuration change, based on the physical layer configuration information, the virtual layer configuration information, and mapping information which is information obtained as a result of the mapping; and an orchestrator part configured to access and run a program which is operative via an API, based on the blueprint, to thereby perform orchestration of the virtual layer.

According to a fourth aspect of the disclosure, an ICT resource management method in an ICT resource management device which manages a physical node and a virtual node, each as an ICT resource, includes the steps of: managing physical layer configuration information which is information on a configuration of the physical node on a physical layer and virtual layer configuration information which is information on a configuration of the virtual node on a virtual layer; performing mapping of the physical layer and the virtual layer; creating, when an externally-provided device requests a change in the configuration, a blueprint which is design information on an infrastructure required for the configuration change, based on the physical layer configuration information, the virtual layer configuration information, and mapping information which is information obtained as a result of the mapping; and accessing and running a program which is operative via an API, based on the blueprint, to thereby perform orchestration of the virtual layer.

In each of the first and the fourth aspects of the disclosure, mapping of the physical layer and the virtual layer makes a clear association between the physical node and the virtual node. This makes it possible to specify an appropriate virtual node even after a change in configuration, without manual intervention, thus allowing an automated operation to be achieved.

Thus, an operation in a distributed system can be automated and a cost to operating the distributed system to which virtualization technology is applied can be reduced.

According to a second aspect of the disclosure, in the ICT resource management device according to the first aspect, the blueprint includes: a group of catalogs, each of which shows a process used for providing a service; and a parameter as information on an input into the catalog.

In the second aspect of the disclosure, a workflow for performing orchestration can be easily created and deployed.

According to a third aspect of the disclosure: the ICT resource management device according to the first aspect of the second aspect further includes a monitor part configured to monitor the physical node and the virtual node; the configuration information management part is configured to create the physical layer configuration information and the virtual layer configuration information from information collected by monitoring by the monitor part; and the layer mapping part is configured to create the mapping information from the information collected by monitoring by the monitor part.

In the third aspect of the disclosure, the configuration information and the mapping information can be kept up-to-date. This makes it possible to create an appropriate blueprint without manual intervention and perform orchestration, thus allowing an automated operation to be achieved.

According to a fifth aspect of the disclosure, an ICT resource management program causes a computer to serve as the ICT resource management device according to any one of first to third aspects.

In the fifth aspect of the disclosure, the ICT resource management device can be easily built and deployed.

Advantageous Effects of the Invention

The present invention can achieve an automated operation of a distributed system and reduce a cost operating a distributed system to which virtualization technology is applied.

BRIEF DESCRIPTION OF THE DRAWINGS

FIG. 3 is a data structure diagram illustrating an example of physical layer configuration information according to the embodiment.

FIG. 4 is a data structure diagram illustrating an example of virtual layer configuration information according to the embodiment.

FIG. 5 is a diagram for explaining an example of a blueprint according to the embodiment.

FIG. 6 is a sequence diagram illustrating an example of a processing performed according to the embodiment.

EMBODIMENT FOR CARRYING OUT THE INVENTION

An embodiment for carrying out the present invention (which may also be referred to as "this embodiment" hereinafter) is described with reference to the related drawings.
<<Configuration>>

Figure 1:
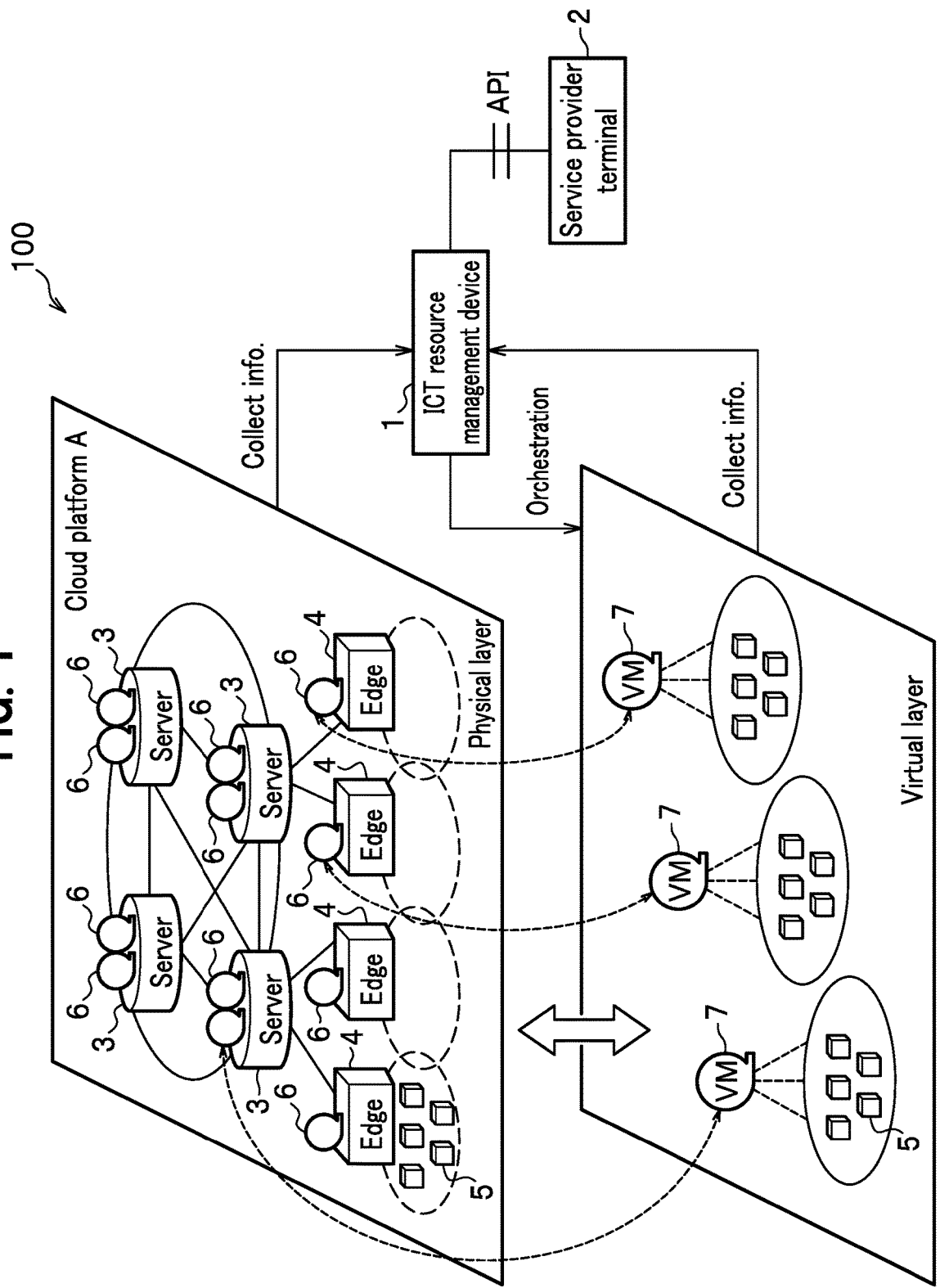
FIG. 1 is a functional configuration diagram illustrating an example of a distributed system including an ICT resource management device according to an embodiment of the present invention.

As illustrated in FIG. 1, a distributed system 100 including an ICT resource management device 1 according to this embodiment: is a system to which virtualization technology is applied; and includes the ICT resource management device 1, a service provider terminal 2, a server 3, an edge 4, and a device 5. The distributed system 100 is configured to manage: a physical layer which is a collection of physical nodes; and a virtual layer which is a collection of virtual nodes, each of which is configured and operates on a physical node. Each of the server 3, the edge 4, and the device 5 serves as a physical node constituting the physical layer. A VM (Virtual Machine) 7 disposed on the virtual layer as illustrated in FIG. 1 is a virtual node in which the server 3 or the edge 4 is virtualized.

The ICT resource management device 1 manages the physical node and the virtual node, each as an ICT resource.

The service provider terminal 2 is a terminal which requests to change a configuration in such as, for example, an initial deployment and a scale variability. The service provider terminal 2 makes such a request via an API (Application Programming Interface). The API is a northbound API between the ICT resource management device 1 and the service provider terminal 2. The service provider terminal 2 is used by a service provider or the like.

The server 3 is a computing machine which performs a process of providing a service. The server 3 illustrated in FIG. 1 is arranged on a cloud platform A and performs a process for cloud service. The server 3 has therein one or more applications 6 for implementing a process of providing a service.

The edge 4: is a networking device installed on a NW (a network); and includes, for example, a router, a bridge, and a gateway. The edge 4 has therein one or more applications 6 for implementing a process of providing a service. The server 3 and the edge 4 are communicably connected to each other.

The device 5 is equipment by which an end user uses a service; and includes, for example, IoT equipment. Upon connection to the edge 4, the device 5 can use a service.

The ICT resource management device 1 collects information on a physical node and a virtual node. The ICT resource management device 1 performs mapping of the physical layer and the virtual layer, using the collected information (see the dashed double-headed arrows in FIG. 1).

The ICT resource management device 1 performs orchestration of the virtual layer. More specifically, the ICT resource management device 1 makes deployment of a service and assignment of a resource to the VM 7.

<Details of ICT Resource Management Device 1>

Figure 2:
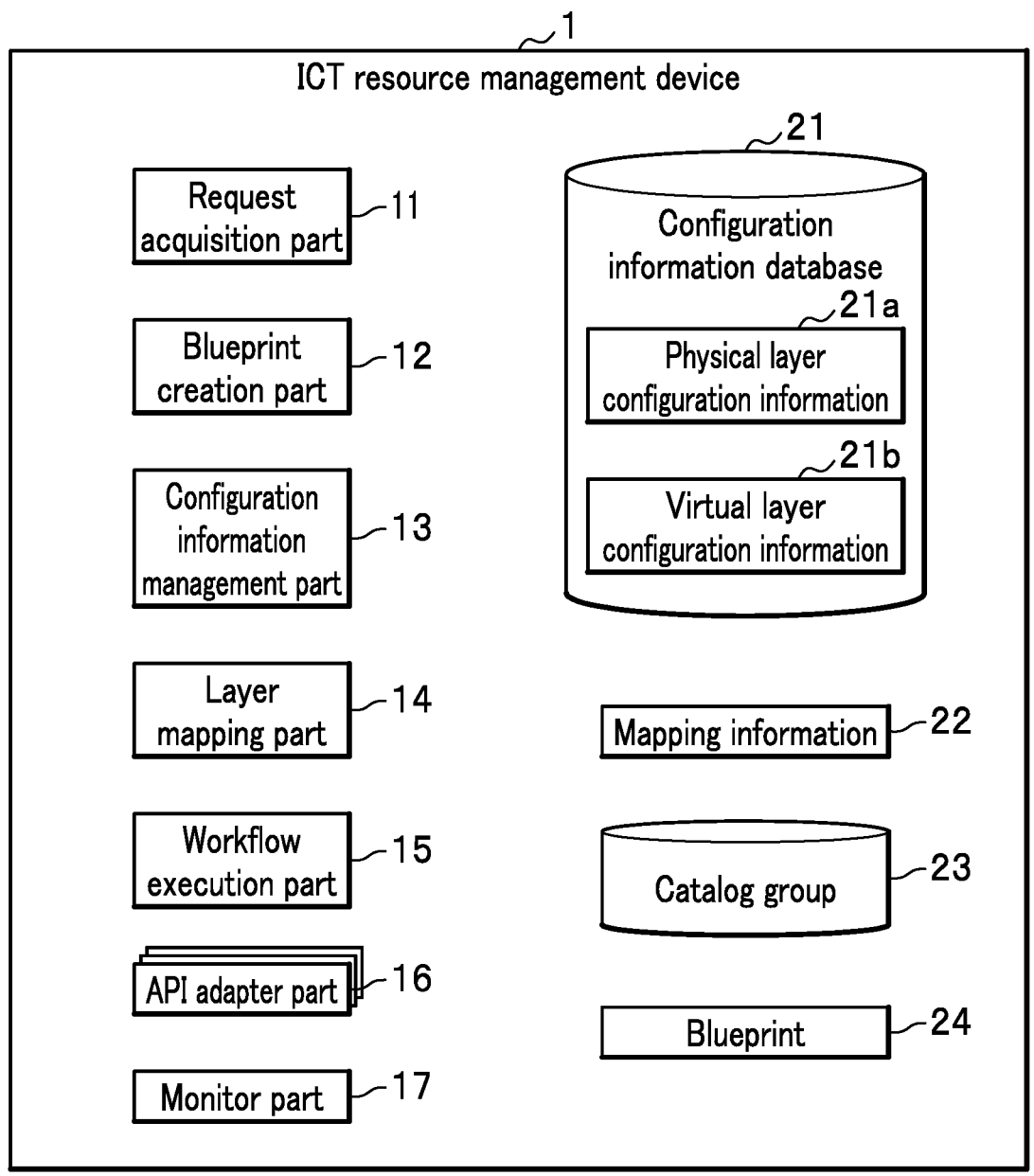
FIG. 2 is a functional configuration diagram illustrating an example of the ICT resource management device according to the embodiment.

As illustrated in FIG. 2, the ICT resource management device 1 includes such function parts as a request acquisition part 11, a blueprint creation part 12, a configuration information management part 13, a layer mapping part 14, a workflow execution part 15, an API adapter part 16, and a monitor part 17. The ICT resource management device 1 stores, in a storage thereof, a configuration information database 21, mapping information 22, a catalog group 23, and a blueprint 24. The storage included in the ICT resource management device 1 may be disposed, for example, inside of the ICT resource management device 1 or outside thereof.

[Request Acquisition Part 11]

The request acquisition part 11 acquires a request to change a configuration from the service provider terminal 2. Such a request acquired by the request acquisition part 11 may also be referred to as "order information". Not only the service provider terminal 2 but also, for example, a terminal of a person in charge of maintenance of the distributed system 100 can make a request for a configuration change. Each of the service provider terminal 2 and the terminal of the maintenance person as described above may also be referred to as an externally-provided device.

[Blueprint Creation Part 12]

The blueprint creation part 12 creates the blueprint 24 corresponding to the order information acquired by the request acquisition part 11. The blueprint 24 is design information on an infrastructure required for a requested change in configuration. The infrastructure represents a component of an operating environment of a service; and includes components of various types such as, for example, an ICT resource itself, set information on the ICT resource (for example, a VM name, an IP address, and a host name), an allocated resource thereof, a LB (load balancer) set on a network, a FW (firewall), and a container.

[Configuration Information Management Part 13]

The configuration information management part 13 manages information on an ICT resource as configuration information. The configuration information management part 13 collects information on a physical node and a virtual node, by, for example, accessing an API for collecting resource information. The API for collecting resource information used herein is an API for providing resource information which is prepared by a target for orchestration. The API for collecting resource information is a southbound API between the ICT resource management device 1 and a target for orchestration. Information collected includes, for example but not limited to, a MIB (Management Information Base) by the SNMP (Simple Network Management Protocol). The configuration information managed by the configuration information management part 13: is stored in the configuration information database 21; and is divided into physical layer configuration information 21a and virtual layer configuration information 21b.

The target for orchestration includes but not limited to a physical node and a virtual node. An interface provided by the target for orchestration may be provided by, for example, a controller (not illustrated) which controls the target for orchestration of interest or by each of a physical node and a virtual node.

The physical layer configuration information 21a is configuration information on a physical node on a physical layer. As illustrated in FIG. 3, the physical layer configuration information 21a includes such management items as, for example, "Node ID", "State", "Host Name", "IP Address", "VM ID", "Service Used", and "User", each as a column header. Values of respective management items are stored therein for each of physical nodes.

The management item "Node ID" contains an identifier of a physical node of interest.

The "State" contains an operating state of the physical node ("OK" in normal operating state and "NG" in malfunction state).

The "Host Name" contains a host name of the physical node.

The "IP Address" contains an IP address assigned to the physical node.

The "VM ID" contains an identifier of a VM operating on the physical node.

The "Service Used" contains an identifier of a service which can be used at the physical node. The service used includes, for example but not limited to a cloud service and an edge computing service. The service used may include a service which is available at each of a plurality of physical nodes, as the same service.

The "User" contains an identifier of a user who uses the service used of interest. The user may be, for example, a business entity or an individual. In another example, when a physical node of interest is an edge device, a user corresponding thereto is limited to an owner of the edge device.

The management items of the physical layer configuration information 21a illustrated in FIG. 3 are given as an example and any other management item may be added thereto. For example, a memory size of a VM operating on a physical node of interest, a CPU frequency, a power source state, and a name of the VM may be set as the management items of the physical layer configuration information 21a.

A name of a resource pool used for a physical node of interest and an ID thereof may be set as the management items.

A type of a network in which a physical node of interest is arranged, an ID of the network, and a name thereof may be set as the management items.

An ID of a folder used by a physical node of interest, a type thereof, and a name thereof may be set as the management items.

A storage capacity of a data store used by a physical node of interest, an ID of the data store, a type thereof, and a name thereof may be set as the management items.

An ID of a data center which controls a physical node of interest, and a name thereof may be set as the management items.

A name of a user who accesses a physical node of interest and a password thereof, each as authentication information on the user, may be set as the management items.

Referring back to FIG. 2, the virtual layer configuration information 21b is configuration information on a virtual node on the virtual layer. As illustrated in FIG. 4, the virtual layer configuration information 21b includes such management items as, for example, "Node ID", "State", "VM Name", "IP Address", and "Physical Device ID", each as a column header. Values of respective management items are stored therein for each of the virtual nodes.

The management item "Node ID" contains an identifier of a virtual node of interest.

The "State" contains an operating state of the virtual node ("OK" in normal operating state and "NG" in malfunction state).

The "VM Name" contains a name of the virtual node.

The "IP Address" contains an IP address assigned to the virtual node.

The "Physical Device ID" contains an identifier of a physical node on which the virtual node is arranged.

The management items of the virtual layer configuration information 21b illustrated in FIG. 4 are given as an example and any other management item may be added thereto. For example, a VM ID which is used as information on an ID of a virtual node of interest may be set as the management item of the virtual layer configuration information 21b.

A memory size of a VM as a resource of a virtual node of interest, and a CPU frequency thereof may be set as the management items.

A power source state of a virtual node of interest may be set as the management item.

A name of a user who accesses a virtual node of interest and a password thereof, each as authentication information on the user, may be set as the management items.

A gateway, a VXLAN (Virtual eXtensible Local Area Network), and a static route, each used by a physical node of interest may be set as the management items.

A host name of a physical node on which a virtual node of interest is arranged may be set as the management item.

Information on a hypervisor which creates a virtual node of interest may be set as the management item.

A management item of a container application may be set as the management item set in the virtual layer configuration information 21b. For example, a host name of a container host registered as a container used by a virtual node of interest, a label thereof, a state thereof, and an account ID thereof may be set as management items of the virtual layer configuration information 21b.

An ID of a service provided by a container used by a virtual node of interest, a name thereof, a state thereof, and a scale thereof (the number of units of servers used) may be set each as the management items.

A mount of a volume of a storage device provided by a container used by a virtual node of interest, an ID thereof (only when RancherNFS (Network File System) is used), and an image ID thereof may be set as the management items.

A group of stacks of a storage device provided by a container used by a virtual node of interest, a health state thereof, a stack ID thereof, and an ID of a service used thereof may be set as the management items.

[Layer Mapping Part 14]

Referring back to FIG. 2, the layer mapping part 14 performs mapping of the physical layer and the virtual layer. More specifically, the layer mapping part 14 determines to which physical node (or to which application 6 installed on the physical node) on the physical layer a virtual node on the virtual layer is associated, based on the configuration information managed by the configuration information management part 13. The ICT resource management device 1 stores a result of the association between the physical node and the virtual node determined by the layer mapping part 14, as the mapping information 22. For example, the layer mapping part 14 references the management item "VM ID" in the physical layer configuration information 21a (FIG. 3) and the management item "Physical Device ID" in the virtual layer configuration information 21b (FIG. 4), to thereby determine an association between a physical node and a virtual node.

The blueprint 24 is described in detail with reference to FIG. 5. FIG. 5 is a diagram for explaining the blueprint 24 for initial deployment. As illustrated in FIG. 5, the blueprint 24 is configured as a service template paired with a parameter. The service template may be composed of a group of catalogs. The catalog: is a template used in a process of providing a service; and is a component element of the catalog group 23 stored in the ICT resource management device 1. The catalog is well known, description of which is thus omitted herein. The parameter is input information to each of the catalogs.

The blueprint 24 illustrated in FIG. 5 is that at initial deployment. The order information acquired by the request acquisition part 11 is thus order information on the initial deployment. At the initial deployment, the blueprint creation part 12 selects, for example, a catalog for creating a VM, a catalog for setting a network, and a catalog for setting a container, from the catalog group 23, to thereby configure a service template.

The number and types of parameters inputted into the catalog for creating a VM are, for example, same as those of VMs to be created. In FIG. 5, a parameter of specifying a total of five VMs is inputted into the catalog for creating a VM. Herein, of the five VMs, three units of VMs each function as a Web server and two units of VMs each function as an AP server (an application server). An input of a parameter into the catalog for creating a VM may be performed by, for example, the service provider terminal 2.

A parameter inputted into the catalog for setting a network is, for example, assignment of an IP address (an IP assignment). In FIG. 5, a parameter specifying an IP address assigned to a created VM is inputted into the catalog for setting a network. The parameter inputted into the catalog for setting a network may be acquired from, for example, the distributed system 100.

A parameter inputted into the catalog for setting a container is, for example, a method of setting a container used by a created VM. In FIG. 5, a parameter representing a setting method of executing a copy by Rancher is inputted into the catalog for setting a container. An input of a parameter into the catalog for setting a container may be performed by, for example, the service provider terminal 2.

The blueprint creation part 12: selects a necessary catalog from the catalog group 23 in accordance with an operation indicated by the order information acquired by the request acquisition part 11; and thereby creates a service template. The blueprint creation part 12 can acquire the parameter inputted into the selected catalog from the order information or the distributed system 100. That is, the blueprint creation part 12: requests a parameter inputted into the selected catalog, from the service provider terminal 2 having transmitted the order information or the like; and receives the order information again as a response to the request, to thereby acquire the parameter from the order information. When the distributed system 100 itself can acquire a parameter at a time of, for example, IP address dispensing, the blueprint creation part 12 acquires a parameter inputted into the selected catalog from the distributed system 100.

In creating the blueprint 24, the blueprint creation part 12 references the configuration information managed by the configuration information management part 13 and the mapping information 22 stored by the layer mapping part 14. That is, the blueprint creation part 12 compares: respective current states of a physical node and a virtual node of interest determined from the physical layer configuration information 21a, the virtual layer configuration information 21b, and the mapping information 22; with a request of a service provider or the like indicated by the order information, based on which the blueprint 24 is created.

[Workflow Execution Part 15]

The workflow execution part 15 executes a workflow in accordance with the blueprint 24 created by the blueprint creation part 12. The workflow is a sequence of processes which are indicated by a catalog in the blueprint 24 and are combined in a systematic order. In the blueprint 24 at the initial deployment illustrated in FIG. 5, a workflow at the initial deployment is a sequence of such processes as "Create a VM→Set a network→Set a container" in this order. Upon execution of a workflow by the workflow execution part 15, an orchestration is performed and a resource is allocated to an ICT resource.

[API Adapter Part 16]

The API adapter part 16 is an interface to access a program which can be operated via an API, in response to an instruction from the workflow execution part 15 which executes the workflow. Such an API is a southbound API between the API adapter part 16 (or the ICT resource management device 1 including the API adapter part 16) and a target for orchestration. The API adapter part 16 is interface-connectable to each of targets for orchestration. A plurality of the API adapter parts 16 can be provided for each program which is operative via the API. Execution of a program operative via an API by the workflow execution part 15 makes it possible to perform a workflow.

A combination of the workflow execution part 15 and the API adapter part 16 works as an orchestrator part which performs orchestration.

[Monitor Part 17]

The monitor part 17 monitors a physical node on the physical layer and a virtual node on the virtual layer by, for example, SNMP. A monitored result obtained by the monitor part 17 shows how a service is used, to which an orchestration has been performed, to thereby become available. The monitored result obtained by the monitor part 17 is transmitted to the configuration information management part 13. The configuration information management part 13 collects information on a physical node and a virtual node from the monitored result obtained by the monitor part 17.

<<Processing>>

A processing performed by the ICT resource management device 1 according to this embodiment is described with reference to FIG. 6. The processing is started when, for example, the service provider terminal 2 or the like makes a request for an operation such as a configuration change.

The request acquisition part 11 outputs order information showing an operation such as a configuration change, to the blueprint creation part 12 (step S1). The blueprint creation part 12 requests configuration information of interest, from the configuration information management part 13 (step S2). The configuration information management part 13 outputs the configuration information stored in the configuration information database 21, more specifically, the physical layer configuration information 21a and the virtual layer configuration information 21b, to the blueprint creation part 12 (step S3).

The blueprint creation part 12 requests the mapping information 22 from the layer mapping part 14 (step S4). The layer mapping part 14 outputs the mapping information 22 to the blueprint creation part 12 (step S5).

The blueprint creation part 12 creates the blueprint 24 into the order information, based on the configuration information and the mapping information (step S6). At this time, the blueprint creation part 12: selects a catalog required for the operation, from the catalog group 23, depending on the order information; and acquires a parameter inputted into the selected catalog, from the order information or the distributed system 100.

The blueprint creation part 12: transmits the created blueprint 24 to the service provider terminal 2 or the like which has transmitted the order information, via the request acquisition part 11; and requests therefrom an acknowledgment of the blueprint 24 (step S7). If a positive acknowledgement of the blueprint 24 is received therefrom, the request acquisition part 11 transmits information showing the positive acknowledgement from the service provider terminal 2 or the like, to the blueprint creation part 12 (step S8).

Of the entire processing performed by the ICT resource management device 1, step S1 to step S8 constitute infrastructure designing.

In order to expedite the processing, step S7 and step S8 may be omitted.

The blueprint creation part 12 creates a script for performing an orchestration based on the acknowledged blueprint 24 (step S9). A technique of creating a script is well known, description of which is thus omitted herein. The blueprint creation part 12 then outputs the created script to the workflow execution part 15 (step S10).

Of the entire processing performed by the ICT resource management device 1, step S9 and step S10 perform creation of a script.

The workflow execution part 15 interprets the script acquired from the blueprint creation part 12 (step S11). A technique of interpreting a script is well known, description of which is thus omitted herein. The workflow execution part 15 gives an appropriate instruction to the API adapter part 16 for each of programs, each of which can be operated via an API (step S12), to thereby execute an appropriate process.

When execution of the process has been successfully completed, the API adapter part 16 notifies the workflow execution part 15 of the completion of the process execution (step S13). The workflow execution part 15 notifies the blueprint creation part 12 of the completion of the process execution (step S14). The completion of the process execution means: that an orchestration from the ICT resource management device 1 to the virtual layer has been completed; and that a service after the configuration change becomes available.

Of the entire processing performed by the ICT resource management device 1, step S11 to step S14 perform orchestration.

The monitor part 17 then starts monitoring a physical node on the physical layer and a virtual node on the virtual layer. The monitor part 17 notifies the configuration information management part 13 of information collected by the monitoring (step S15). The configuration information management part 13 notifies the layer mapping part 14 of the information collected from the monitor part 17 (step S16).

Of the entire processing performed by the ICT resource management device 1, step S15 to step S16 perform monitoring.

The configuration information management part 13: creates configuration information based on the information collected by the monitor part 17; and stores the created configuration information in the configuration information database 21. The layer mapping part 14 creates the mapping information 22 based on the information collect by the monitor part 17 via the configuration information management part 13. The created configuration information and the mapping information 22 is used for creating a new blueprint.

In the processing illustrated in FIG. 6, the ICT resource management device 1 can keep the configuration information and the mapping information 22 up-to-date. This makes it possible to create an appropriate blueprint without manual intervention and perform orchestration, thus allowing an automated operation to be achieved.

<Specific Example of Initial Deployment>

Figure 7:
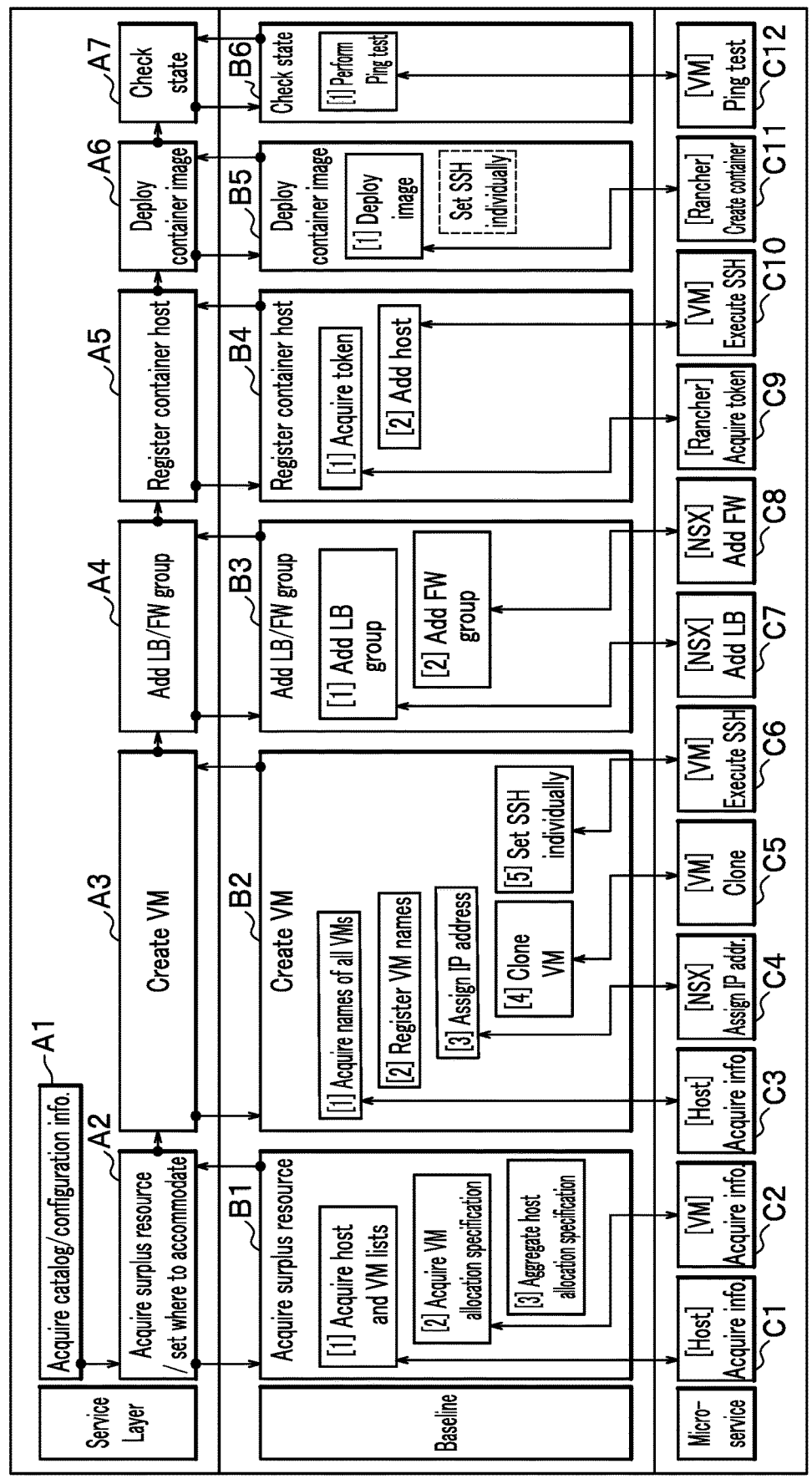
FIG. 7 is a diagram for explaining an example of operations at an initial deployment according to the embodiment.

An example of executing a workflow at an initial deployment as an automated operation is described in detail with reference to FIG. 7. As illustrated in FIG. 7, the workflow at the initial deployment can be defined by using, for example MSA (Micro Service Architecture) and can be designed with three layers, namely, a service layer, a baseline, and a microservice.

The service layer registers therein steps of the workflow at the initial deployment, in which the steps are appropriately connected in a prescribed order. As illustrated in FIG. 7, the workflow at the initial deployment: is divided into steps as follows, "Acquire catalog/configuration information A1", "Acquire surplus resource/set where to accommodate A2", "Create VM A3", "Add LB/FW group A4", "Register container host A5", "Deploy container image A6", and "Check state A7"; and is executed in this order.

In "Acquire catalog/configuration information A1", a catalog is selected from the catalog group 23 and the configuration information management part 13 acquires configuration information.

In "Acquire surplus resource/set where to accommodate A2", a surplus resource of each of ICT resources is acquired and a physical node into which a created VM is accommodated is set.

In "Create VM A3", a VM in which an application used for a service of interest is provided is created.

In "Add LB/FW group A4", a group of load balancers and a group of firewalls are added into a network.

In "Register container host A5", an environment for causing a container used by the created VM to be executed is constructed. A host machine for causing the container to be operated is additionally created, and the added host machine is registered in a controller for managing the container.

In "Deploy container image A6", a containerized application is installed in the host machine for causing the container to be operated. The containerized application is made into an image file and is installed in a host machine for specifying an image of interest.

In "Check state A7", a state of the created VM is checked as a final stage of the initial deployment.

The baseline registers therein a component in each of the steps of the service layer. The registered component may be configured as a catalog. Each of the steps in the service layer can be implemented by a combination of components illustrated in a corresponding section of the baseline. As illustrated in FIG. 7, the baseline at the initial deployment registers therein "Acquire surplus resource B1", "Create VM B2", "Add LB/FW group B3", "Register container host B4", "Deploy container image B5", and "Check state B6".

In "Acquire surplus resource B1", a component of "Acquire surplus resource/set where to accommodate A2" is registered. The component registered in "Acquire surplus resource B1" is, for example, [1] Acquire host and VM lists, [2] Acquire VM allocation specification, and [3] Aggregate host allocation specification. The registered component is not, however, limited to those described above.

In "Create VM B2", a component of "Create VM A3" is registered. The component registered in "Create VM B2" is, for example, [1] Acquire names of all VMs, [2] Register VM names, [3] Assign IP address, [4] Clone VM, and [5] Set SSH (Secure Shell) individually. The registered component is not, however, limited to those described above.

In "Add LB/FW group B3, a component of "Add LB/FW group A4" is registered. The component registered in "Add LB/FW group B3" is, for example, [1] Add LB group and [2] Add FW group. The registered component is not, however, limited to those described above.

In "Register container host B4", a component of "Register container host A5" is registered. The component registered in "Register container host B4" is, for example, [1] Acquire token and [2] Add host. The registered component is not, however, limited to those described above.

In "Deploy container image B5", a component of "Deploy container image A6" is registered. The component registered in "Deploy container image B5" is, for example [1] Deploy image, and an individual setting of SSH can be provided when needed. The registered component is not, however, limited to that described above.

In "Check state B6", a component of "Check state A7" is registered. The component registered in "Check state B6" is, for example, [1] Perform Ping test. The registered component is not, however, limited to that described above.

The microservice registers therein a function for executing a component registered in the baseline. As illustrated in FIG. 7, the microservice at the initial deployment registers therein "[Host] Acquire information C1", "[VM] Acquire information C2", "[Host] Acquire information C3", "[NSX] Assign IP address C4", "[VM] Clone C5", "[VM] Execute SSH C6", "[NSX] Add LB C7", "[NSX] Add FW C8", "[Rancher] Acquire token C9", "[VM] Execute SSH C10", "[Rancher] Create container C11", and "[VM] Perform Ping test C12".

In "[Host] Acquire information C1", information on a management item of a physical node (for example, see FIG. 3) is acquired, to thereby perform "[1] Acquire host and VM lists" in "Acquire surplus resource B1".

In "[VM] Acquire information C2", information on a management item of a virtual node (for example, see FIG. 4) is acquired, to thereby perform "[2] Acquire VM allocation specification" of "Acquire surplus resource B1".

In "[Host] Acquire information C3", information on a management item (for example, see FIG. 3) of a physical node is acquired, to thereby perform "[1] Acquire names of all VMs" of "Create VM B2".

In "[NSX] Assign IP address C4", an IP address of a VM is assigned, to thereby perform "[3] Assign IP address" of "Create VM B2".

In "[VM] Clone C5", a VM is cloned, to thereby perform "[4] Clone VM" of "Create VM B2".

In "[VM] Execute SSH C6", A login to a VM is performed and an instruction is executed, to thereby perform "[5] Set SSH (Secure Shell) individually" of "Create VM B2".

In "[NSX] Add LB C7", a LB is added into a network, to thereby perform "[1] Add LB group" of "Add LB/FW group B3".

In "[NSX] Add FW C8", a FW is added into the network, to thereby perform "[2] Add FW group" of "Add LB/FW group B3".

In "[Rancher] Acquire token C9", a container which acquires an authority to perform a processing is created, to thereby perform "[1] Acquire token" of "Register container host B4".

In "[VM] Execute SSH 010", a login to a VM is performed and an instruction is executed, to thereby perform "[2] Add host" of "Register container host B4".

In "[Rancher] Create container C11", a containerized application is created, to thereby perform "[1] Deploy image" of "Deploy container image B5".

In "Perform Ping test C12", connectivity is checked, to thereby perform "[1] Perform Ping test" of "Check state B6".

The steps (A1 to A7) in the service layer correspond to a catalog. The components registered in the baseline constitute a part of the catalog. The functions (C1 to C12) shown in the microservice allows a parameter to be inputted into a component of interest registered in the baseline.

In the initial deployment, as illustrated in FIG. 7, the workflow execution part 15: creates a VM based on the previously-created blueprint 24; and deploys a container image. Thus, the workflow execution part 15 can: connect the steps which are originally separated; and perform an automated processing in which a parameter is required in each of the steps.

In this embodiment, mapping of the physical layer and the virtual layer makes a clear association between the physical node and the virtual node. This makes it possible to specify an appropriate virtual node even after a change in configuration, without manual intervention, thus allowing an automated operation to be achieved.

That is, an operation of a distributed system can be automated, and a cost to operate a distributed system to which virtualization technology is applied can be reduced.

In particular, the configuration in which the blueprint 24 includes a group of catalogs and a parameter (see FIG. 5) makes it possible to easily build and deploy a workflow for performing orchestration.

The configuration including the monitor part 17 makes it possible to keep the configuration information and the mapping information up-to-date. Thus, a blueprint can be created without manual intervention, and orchestration can be performed, which contributes to an operation automation.

Using an ICT resource management program to be described hereinafter, the ICT resource management device can be easily built and deployed.

<Program>

A program can be created in which a processing performed by the ICT resource management device 1 according to this embodiment is described in a computer-executable language. In this case, when the computer executes the program, advantageous effects same as those in the embodiment can be obtained. Additionally, the program can be stored in a computer-readable storage medium. A computer loads and executes the program stored in the storage medium, to thereby perform a processing same as that in the embodiment. Next is described an example in which a computer runs an ICT resource management program which achieves a function same as that of the ICT resource management device 1.

Figure 8:
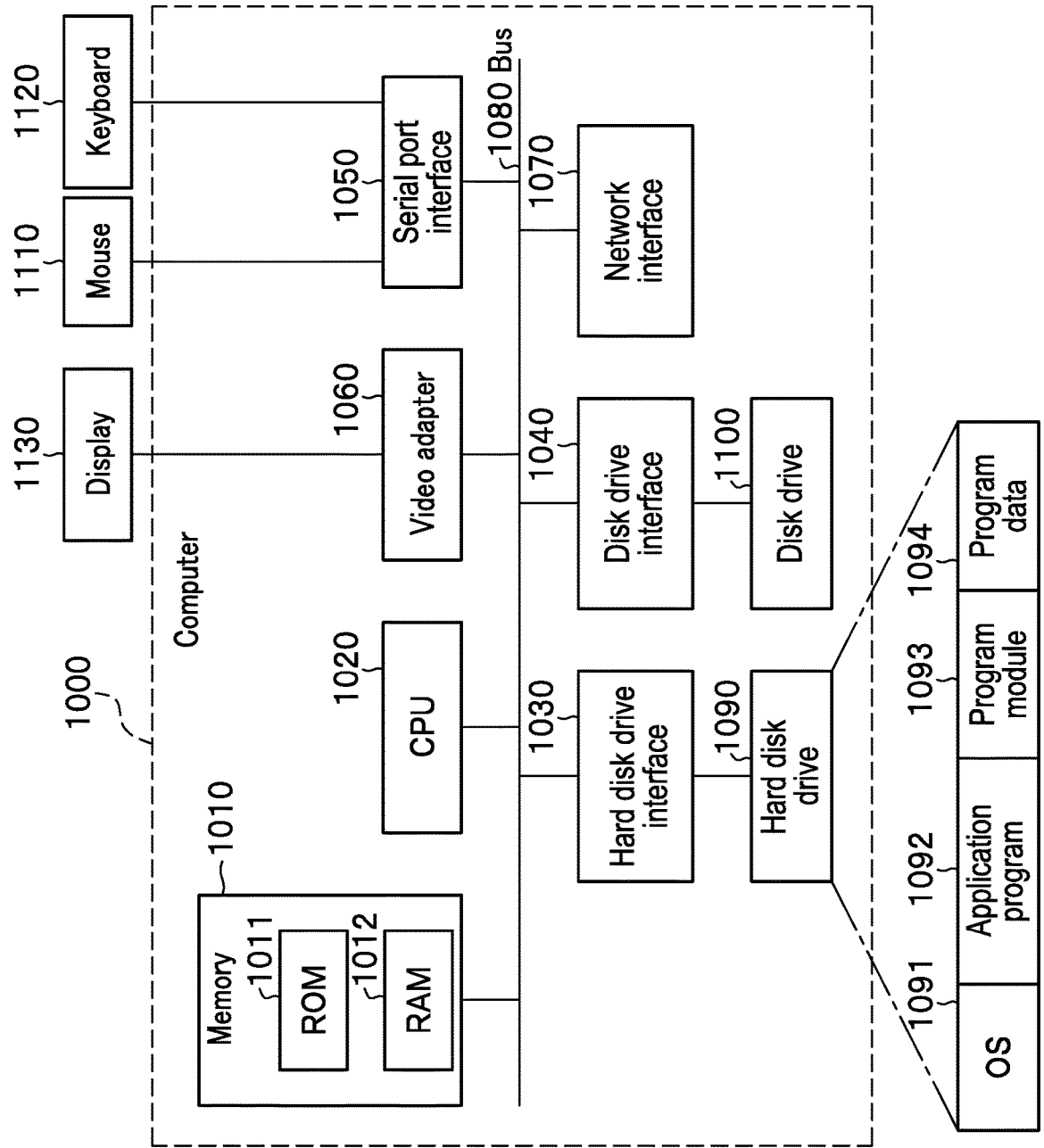
FIG. 8 is a diagram for explaining a computer executing a program of a processing performed according to the embodiment.

FIG. 8 is a diagram illustrating a computer which runs an ICT resource management program. As illustrated in FIG. 8, a computer 1000 includes, for example, a memory 1010, a CPU 1020, a hard disk drive interface 1030, a disk drive interface 1040, a serial port interface 1050, a video adapter 1060, and a network interface 1070, which are connected to each other by a bus 1080.

The memory 1010 includes a ROM (Read Only Memory) 1011 and a RAM (Random Access Memory) 1012. The ROM 1011 stores therein a boot program such as, for example, BIOS (Basic Input Output System). The hard disk drive interface 1030 is connected to a hard disk drive 1090. The disk drive interface 1040 is connected to a disk drive 1100. The disk drive 1100 has a removable storage medium inserted therein, for example, a magnetic disk and an optical disc. The serial port interface 1050 is connected to, for example, a mouse 1110 and a keyboard 1120. The video adapter 1060 is connected to, for example, a display 1130. A storage medium inserted into, for example, the memory 1010, the hard disk drive 1090, the disk drive 1100, and the disk drive 1100 is a specific hardware resource as a storage included in the ICT resource management device 1.

As illustrated in FIG. 8, the hard disk drive 1090 stores therein, for example, an OS 1091, an application program 1092, a program module 1093, and a program data 1094. The tables explained in the above-described embodiment are stored in, for example, the hard disk drive 1090 or the memory 1010.

The ICT resource management program is stored in the hard disk drive 1090 as, for example, a program module in which an instruction executed by the computer 1000 is described. More specifically, a program module in which each of the processings performed by the ICT resource management device 1 explained in the embodiment is stored in the hard disk drive 1090.

Data used in information processing by the ICT resource management program is stored in, for example, the hard disk drive 1090, as program data. The CPU 1020: reads a program module 1093 or a program data 1094 stored in the hard disk drive 1090, into the RAM 1012 according to the necessity; and thereby performs the above-described steps.

The program module 1093 or the program data 1094 of the ICT resource management program is stored in the hard disk drive 1090. The present invention is not, however, limited thereto. The program module 1093 or the program data 1094: may be stored in, for example, a removable storage medium; and may be read out by the CPU 1020 via the disk drive 1100 or the like. Or, the program module 1093 or the program data 1094: may be stored in another computer connected via a LAN (Local Area Network), a WAN (Wide Area Network), or the like; and may be read out by the CPU 1020 via the network interface 1070.

<Others>

(a) The configuration information management part 13 can manage information on a location of a physical node.

(b) The configuration information management part 13 can manage information on a user who uses the device 5 connected to the edge 4 as a physical node or information on a tenant of the user. The configuration information managed as the physical layer configuration information 21a can be used as configuration information by the user or by the tenant. When the layer mapping part 14 performs mapping of the physical layer and the virtual layer, the configuration information by the user or by the tenant can be used as configuration information managed as the virtual layer configuration information 21b.

DESCRIPTION OF REFERENCE NUMERALS 100 distributed system
1 ICT resource management device
2 service provider terminal
3 server
4 edge
5 device
6 application
7 VM
11 request acquisition part
12 blueprint creation part
13 configuration information management part
14 layer mapping part
15 workflow execution part (orchestrator part)
16 API adapter part (orchestrator part)
17 monitor part
21 configuration information database
21a physical layer configuration information
21b virtual layer configuration information 22 mapping information
23 catalog group
24 blueprint

The invention claimed is:

1. An information and communication technology (ICT) resource management device which manages a physical node and a virtual node, each as an ICT resource, the ICT resource management device, comprising:
 a configuration information management part configured to manage physical layer configuration information which is information on a configuration of the physical node on a physical layer and virtual layer configuration information which is information on a configuration of the virtual node on a virtual layer;
 a layer mapping part configured to perform mapping of the physical layer and the virtual layer;
 a blueprint creation part configured to, when an externally-provided device requests a change in the configuration, create a blueprint which is design information on an infrastructure required for the configuration change, based on the physical layer configuration information, the virtual layer configuration information, and mapping information which is information obtained as a result of the mapping; and
 an orchestrator part configured to access and run a program which is operative via an API, based on the blueprint, to thereby perform orchestration of the virtual layer.

2. The ICT resource management device according to claim 1, wherein the blueprint includes: a group of catalogs, each of which shows a process used for providing a service; and a parameter as information on an input into a catalog in the group of catalogs.

3. The ICT resource management device according to claim 1,
 further comprising a monitor part configured to monitor the physical node and the virtual node,
 wherein the configuration information management part is configured to create the physical layer configuration information and the virtual layer configuration information from information collected by monitoring by the monitor part, and
 wherein the layer mapping part is configured to create the mapping information from the information collected by monitoring by the monitor part.

4. An information and communication technology (ICT) resource management program for causing a computer to serve as the ICT resource management device according to claim 1.

5. The ICT resource management device according to claim 2,
 further comprising a monitor part configured to monitor the physical node and the virtual node,
 wherein the configuration information management part is configured to create the physical layer configuration information and the virtual layer configuration information from information collected by monitoring by the monitor part, and
 wherein the layer mapping part is configured to create the mapping information from the information collected by monitoring by the monitor part.

6. An information and communication technology (ICT) resource management program for causing a computer to serve as the ICT resource management device according to claim 2.

7. An information and communication (ICT) resource management program for causing a computer to serve as the ICT resource management device according to claim 3.

8. An information and communication (ICT) resource management program for causing a computer to serve as the ICT resource management device according to claim 5.

9. An information and communication technology (ICT) resource management method in an ICT resource management device which manages a physical node and a virtual node, each as an ICT resource, the ICT resource management method comprising the steps of:
 managing physical layer configuration information which is information on a configuration of the physical node on a physical layer and virtual layer configuration information which is information on a configuration of the virtual node on a virtual layer;
 performing mapping of the physical layer and the virtual layer;
 creating, when an externally-provided device requests a change in the configuration, a blueprint which is design information on an infrastructure required for the configuration change, based on the physical layer configuration information, the virtual layer configuration information, and mapping information which is information obtained as a result of the mapping; and
 accessing and running a program which is operative via an API, based on the blueprint, to thereby perform orchestration of the virtual layer.

* * * * *